United States Patent
Honda

(10) Patent No.: US 7,019,379 B2
(45) Date of Patent: Mar. 28, 2006

(54) SEMICONDUCTOR DEVICE COMPRISING VOLTAGE REGULATOR ELEMENT

(75) Inventor: Hirotsugu Honda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 10/704,697

(22) Filed: Nov. 12, 2003

(65) Prior Publication Data

US 2004/0135225 A1    Jul. 15, 2004

(30) Foreign Application Priority Data

Jan. 9, 2003    (JP)    ............... 2003-002778

(51) Int. Cl.
*H01L 29/861*    (2006.01)
*H01L 31/107*    (2006.01)

(52) U.S. Cl. ............ 257/481; 257/299; 257/305; 257/322; 257/339; 257/345; 257/349; 257/354; 257/375; 257/395; 257/398; 257/399; 257/400; 257/403; 257/404; 257/409; 257/499; 257/500; 257/501; 257/506; 257/519; 257/524

(58) Field of Classification Search ........ 257/106, 257/199, 299, 305, 322, 339, 345, 349, 354, 257/375, 395, 398, 399–400, 403–404, 409, 257/481–482, 499–501, 506, 519, 524, 551, 257/603–606
See application file for complete search history.

(56) References Cited

U.S. PATENT DOCUMENTS

| | | | | |
|---|---|---|---|---|
| 5,170,241 A | * | 12/1992 | Yoshimura et al. ......... 257/339 |
| 5,220,218 A | * | 6/1993 | Hill et al. ................. 326/103 |
| 5,272,098 A | * | 12/1993 | Smayling et al. ........... 438/268 |
| 5,296,393 A | * | 3/1994 | Smayling et al. ........... 438/275 |
| 5,355,011 A | * | 10/1994 | Takata ........................ 257/408 |
| 5,541,435 A | * | 7/1996 | Beasom ...................... 257/409 |
| 5,736,779 A | * | 4/1998 | Kobayashi ................... 257/603 |
| 5,756,387 A | * | 5/1998 | Villa et al. ................... 438/328 |
| 5,917,222 A | * | 6/1999 | Smayling et al. ........... 257/370 |
| 5,952,701 A | * | 9/1999 | Bulucea et al. ............. 257/407 |
| 5,965,921 A | * | 10/1999 | Kojima ....................... 257/369 |
| 5,969,396 A | * | 10/1999 | Iwasa et al. ................. 257/408 |
| 5,977,590 A | * | 11/1999 | Suzuki ........................ 257/339 |
| 6,020,614 A | * | 2/2000 | Worley ....................... 257/349 |
| 6,268,626 B1 | * | 7/2001 | Jeon ........................... 257/335 |
| 6,583,453 B1 | | 6/2003 | Honda et al. |
| 6,740,942 B1 | * | 5/2004 | Baukus et al. .............. 257/406 |
| 6,762,456 B1 | * | 7/2004 | D'Anna et al. ............. 257/335 |
| 6,825,530 B1 | * | 11/2004 | Brown et al. ............... 257/337 |
| 6,844,578 B1 | * | 1/2005 | Harada et al. .............. 257/278 |

(Continued)

FOREIGN PATENT DOCUMENTS

EP    292782 A2    *    11/1988

(Continued)

*Primary Examiner*—Ida M. Soward
(74) *Attorney, Agent, or Firm*—McDermott Will & Emery LLP

(57) ABSTRACT

A semiconductor device includes a heavily doped layer 25 of p-type formed in the surface of an n-type well 21, an intermediately doped layer 26 of p-type formed to adjoin and surround the heavily p-doped layer 25, and an isolation region 22 formed to surround the heavily p-doped layer 25 and the intermediately p-doped layer 26. The heavily p-doped layer 25 has a higher dopant concentration than the well 21. The intermediately p-doped layer 26 has a higher dopant concentration than the well 21 and a lower dopant concentration than the heavily p-doped layer 25.

20 Claims, 7 Drawing Sheets

U.S. PATENT DOCUMENTS

| | | | |
|---|---|---|---|
| 2001/0009288 A1 * | 7/2001 | Kojima et al. | 257/343 |
| 2002/0064917 A1 * | 5/2002 | Yasuoka et al. | 438/275 |
| 2003/0025164 A1 * | 2/2003 | Lee | 257/365 |

FOREIGN PATENT DOCUMENTS

| | | | |
|---|---|---|---|
| EP | 426241 A2 * | 5/1991 | |
| GB | 2130792 A * | 6/1984 | |
| JP | 57085266 A * | 5/1982 | |
| JP | 63-301589 | 12/1988 | |
| JP | 01-260863 | 10/1989 | |
| JP | 2-194645 | 8/1990 | |
| JP | 04216677 A * | 8/1992 | |
| JP | 6-45619 A | 2/1994 | |
| JP | 11-163173 A | 6/1999 | |
| JP | 11-307787 | 11/1999 | |
| JP | 2002-141517 A | 5/2002 | |

* cited by examiner

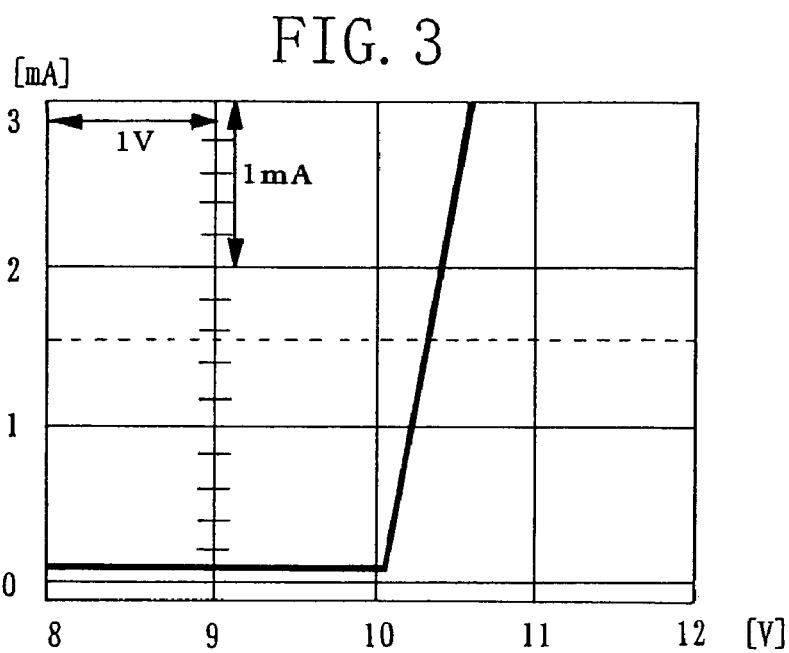
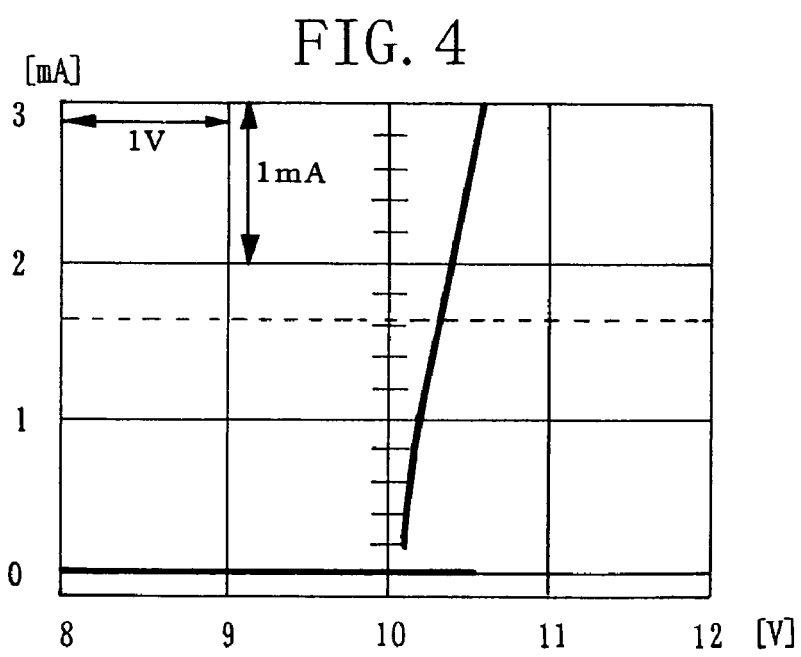

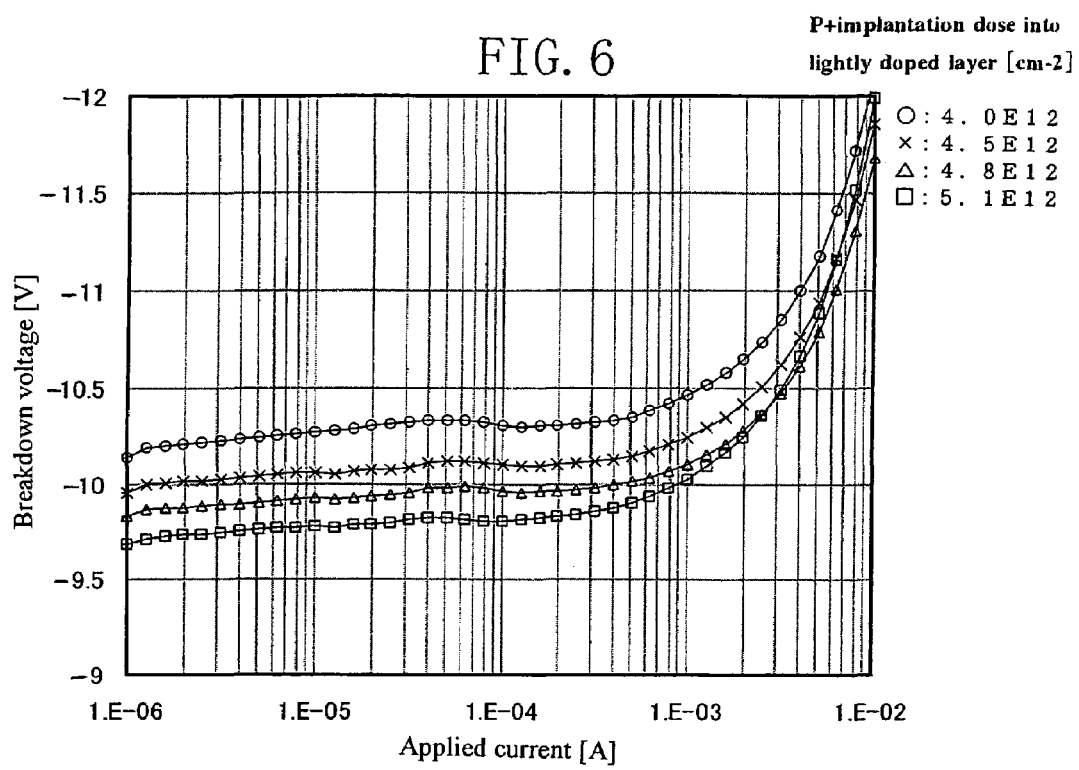
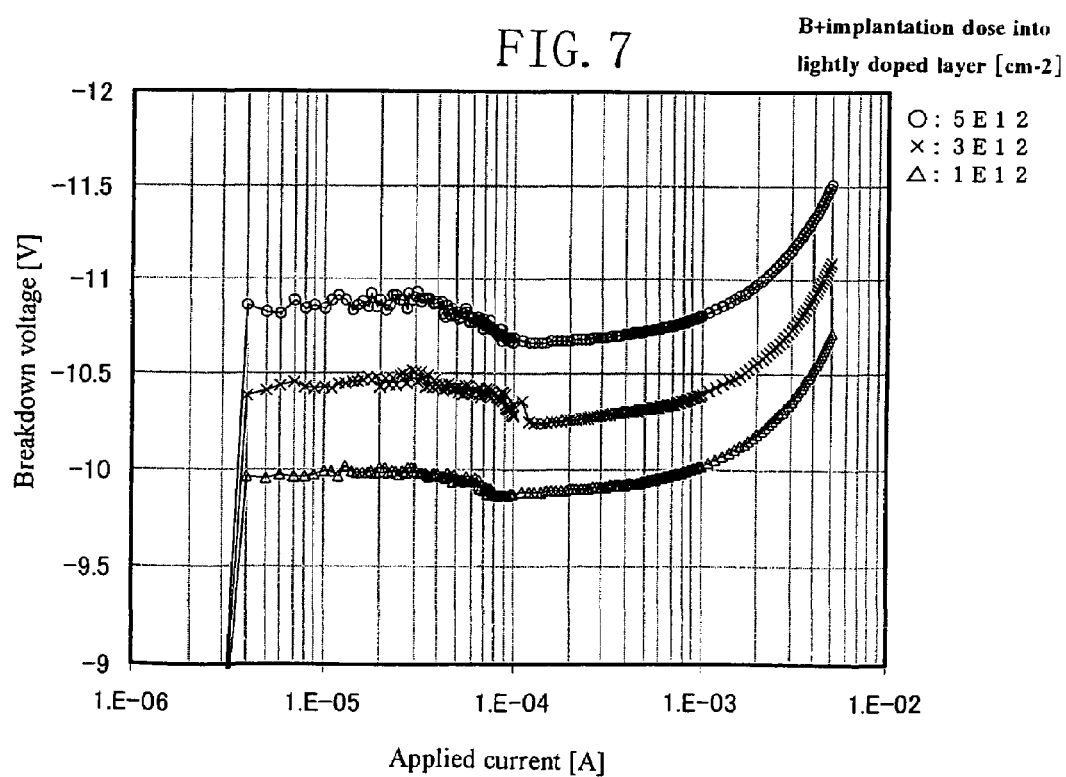

SEMICONDUCTOR DEVICE COMPRISING VOLTAGE REGULATOR ELEMENT

BACKGROUND OF THE INVENTION

The present invention relates to semiconductor devices and in particular to semiconductor devices including a voltage regulator element.

A semiconductor device often includes a voltage regulator element called a clamp diode. The voltage regulator element is to obtain a desired voltage from a voltage boosted by a booster element provided inside the semiconductor device and is also known as a Zener diode. The voltage regulator element can provide a desired voltage by making use of a breakdown phenomenon in the reverse direction of a pn junction which is created between a semiconductor substrate or a well and a doped layer formed on the substrate or the well.

FIG. 10 is a sectional view showing an exemplary structure of a conventional semiconductor device a portion of which is formed with a clamp diode (for example, Japanese Unexamined Patent Publication No. 2002-141517). Referring to FIG. 10, this structure will now be described.

As shown in FIG. 10, the clamp diode is basically composed of an n-type well 1 formed in a semiconductor substrate and a heavily p-doped layer 5 formed in the surface of the n-type well 1. The heavily p-doped layer 5 is surrounded and insulatively isolated with an isolation insulating film 2. A region surrounded with the isolation insulating film 2 is referred hereinafter to as an active region 3. Below the isolation insulating film 2, an n-doped layer 4 as a channel stopper is introduced. The heavily p-doped layer 5 is spaced apart from the isolation insulating film 2 and the n-doped layer 4 by a distance LA.

A thin oxide film 7 is formed on the surface of the active region 3. The thin oxide film 7 is provided with a contact hole 10, which exposes the heavily p-doped layer 5. A portion of the heavily p-doped layer 5 exposed in the contact hole 10 is connected to an aluminum interconnect 11 for an electrode. On the thin oxide film 7, an electrode 8 of a single-layered structure made of polycrystalline silicon is formed which terminates at a position apart from the heavily p-doped layer 5 by an offset region LB. An interlayer insulating film 9 is formed between the electrode 8 and the electrode 11. The electrode 8 is connected to an aluminum interconnect 12 for an electrode through contact holes 10.

In the case of the clamp diode shown in FIG. 10, with the electrode 8 made floating, a negative voltage is applied to the heavily p-doped layer 5 through the aluminum interconnect 11 until the breakdown voltage in the reverse direction applied to the pn junction between the heavily p-doped layer 5 and the n-type well 1 reaches 10 to 20 V, for example, thereby providing a desired constant voltage. In the above structure, provision of the distance LA and the offset region LB makes it possible to suppress fluctuations in the breakdown value of clamp voltage of the clamp diode with passage of time.

The conventional technique described above attains the clamp diode of which the fluctuations in the clamp breakdown voltage with passage of time are suppressed. However, the problem the clamp diode carries is not limited to such fluctuations. Therefore, there is demand for the development of a clamp diode with fewer defects, that is, the development of a clamp diode with more outstanding properties, and it is desirable that the demand be met.

SUMMARY OF THE INVENTION

The present invention has been made in view of said fact and its object is to provide a semiconductor device including a voltage regulator element with more outstanding properties than a conventional clamp diode.

A first semiconductor device according to the present invention comprises: a heavily doped layer of a second conductivity type which is formed in a semiconductor layer of a first conductivity type; an intermediately doped layer of the second conductivity type which is formed to adjoin and surround the heavily doped layer; and an isolation region which is formed to surround a region containing the heavily doped layer and the intermediately doped layer. In this device, the heavily doped layer of the second conductivity type has a higher dopant concentration than the semiconductor layer of the first conductivity type. The intermediately doped layer of the second conductivity type has a dopant concentration higher than the semiconductor layer of the first conductivity type and lower than the heavily doped layer of the second conductivity type.

The concentration of the second conductivity type dopant contained in the intermediately doped layer is preferably $1 \times 10^{18}$ cm$^{-3}$ or lower.

The dopant concentration of the heavily doped layer is preferably equal to or more than a hundred times that of the intermediately doped layer.

A second semiconductor device according to the present invention comprises a voltage regulator element. The voltage regulator element includes: a heavily doped layer of a second conductivity type which is formed in a semiconductor layer of a first conductivity type; an intermediately doped layer of the second conductivity type which is formed to adjoin and surround the heavily doped layer; and an isolation region which is formed to surround a region containing the heavily doped layer and the intermediately doped layer. In this element, the heavily doped layer of the second conductivity type has a higher dopant concentration than the semiconductor layer of the first conductivity type. The intermediately doped layer of the second conductivity type has a higher dopant concentration than the semiconductor layer of the first conductivity type. The dopant concentration of the heavily doped layer is equal to or more than a hundred times that of the intermediately doped layer.

The effective dopant concentration of the intermediately doped layer is preferably $1 \times 10^{18}$ cm$^{-3}$ or lower.

The junction depth of the heavily doped layer is preferably greater than that of the intermediately doped layer.

It is preferable that a region of the semiconductor layer surrounded with the isolation region is formed with a lightly doped layer of the first conductivity type which covers the under surfaces of the heavily doped layer and the intermediately doped layer and that the lightly doped layer of the first conductivity type has a dopant concentration higher than the semiconductor layer of the first conductivity type and lower than the intermediately doped layer of the second conductivity type.

The intermediately doped layer is preferably formed apart from the isolation region.

In a preferred embodiment, an insulating layer is formed on the region of the semiconductor layer surrounded with the isolation region, and the insulating layer includes an opening which exposes at least part of the heavily doped layer. Moreover, an electrode is formed on the insulating layer and the isolation region, and with the heavily doped layer as center, the electrode extends from the isolation region and terminates at a position located above the outside of the intermediately doped layer.

A third semiconductor device according to the present invention comprises: a heavily doped layer of a second conductivity type which is formed in a semiconductor layer of a first conductivity type; an intermediately doped layer of the second conductivity type which is formed to adjoin and surround the heavily doped layer; and an isolation region which is formed to surround a region containing the heavily doped layer and the intermediately doped layer. In this device, the heavily doped layer of the second conductivity type has a higher dopant concentration than the semiconductor layer of the first conductivity type. The intermediately doped layer of the second conductivity type has a dopant concentration higher than the semiconductor layer of the first conductivity type and lower than the heavily doped layer of the second conductivity type. The semiconductor layer of the first conductivity type and at least the heavily doped layer out of the heavily doped layer and the intermediately doped layer collaboratively function as a voltage regulator diode. The junction depth of the heavily doped layer is greater than that of the intermediately doped layer. The dopant concentration of the intermediately doped layer is made lower than that of the heavily doped layer so that the initiation of the voltage breakdown is made at the border between the semiconductor layer of the first conductivity type and the heavily doped layer.

It is preferable that the voltage-breakdown initiation region is present in the vicinity of the border between the bottom and side surfaces of the heavily doped layer and that the heavily doped layer and the intermediately doped layer differ in the dopant concentration by a hundred times or more.

In a further preferred embodiment, the semiconductor layer of the first conductivity type is a semiconductor substrate of the first conductivity type or a well of the first conductivity type.

In still a further embodiment, a fabricating method of a semiconductor device preferably comprises the steps of forming, in the surface of a semiconductor layer of a first conductivity type, an isolation region surrounding a predetermined region; forming, in the predetermined region, an intermediately doped layer of a second conductivity type having a higher dopant concentration than the semiconductor layer; and forming, in the center portion of the intermediately doped layer, a heavily doped layer of the second conductivity type having a higher dopant concentration than the intermediately doped layer.

Another fabricating method of a semiconductor device according to the present invention preferably comprises the steps of: forming, in the surface of a semiconductor layer of a first conductivity type, an isolation region surrounding a predetermined region; forming, in the predetermined region, a lightly doped layer of the first or a second conductivity type having a higher dopant concentration than the semiconductor layer; forming, in the upper portion of the lightly doped layer, an intermediately doped layer of the second conductivity type having a higher dopant concentration than the lightly doped layer; and forming, in the center portion of the intermediately doped layer, a heavily doped layer of the second conductivity type having a higher dopant concentration than the intermediately doped layer.

More preferably, in the step of forming an intermediately doped layer, the concentration of the second conductivity type dopant or the effective dopant concentration of the intermediately doped layer is $1 \times 10^{18}$ cm$^{-3}$ or lower.

More preferably, in the step of forming a heavily doped layer, the heavily doped layer is formed such that the dopant concentration of the heavily doped layer is equal to or more than a hundred times that of the intermediately doped layer.

More preferably, the junction of the heavily doped layer is formed to have a greater depth than that of the intermediately doped layer.

Preferably, the fabricating method of a semiconductor device further comprises the steps of: forming, on a portion of the semiconductor substrate or the well present in the predetermined region, an insulating layer having a smaller thickness than the isolation region; and forming an electrode on part of the insulating layer.

BRIEF DESCRIPTION OF THE DRAWINGS

FIG. 3 is a photograph as a substitute for a drawing showing the voltage-current characteristic, drawn by a curve tracer, of the semiconductor device according to the first embodiment of the present invention.

FIG. 4 is a photograph as a substitute for a drawing showing the voltage-current characteristic, drawn by the curve tracer, of another semiconductor device having an intermediately p-doped layer with an effective dopant concentration more than $1 \times 10^{18}$ cm$^{-3}$.

FIG. 6 is a graph showing the current-voltage characteristic of the semiconductor device according to the first embodiment of the present invention.

FIG. 7 is a graph showing the current-voltage characteristic of another said semiconductor device having the intermediately p-doped layer with an effective dopant concentration more than $1 \times 10^{18}$ cm$^{-3}$.

DETAILED DESCRIPTION OF THE PREFERRED EMBODIMENTS

The inventors diligently studied a conventional clamp diode with the aim of further enhancing its properties. As a consequence, the breakdown voltage of the diode was successfully improved, and the instability of the breakdown voltage thereof in applying a low current was successfully suppressed. Then, the inventors arrived at the concept of the present invention. Hereinafter, embodiments of the present invention will be described with reference to the accompanying drawings.

(First Embodiment)

Figure 1:
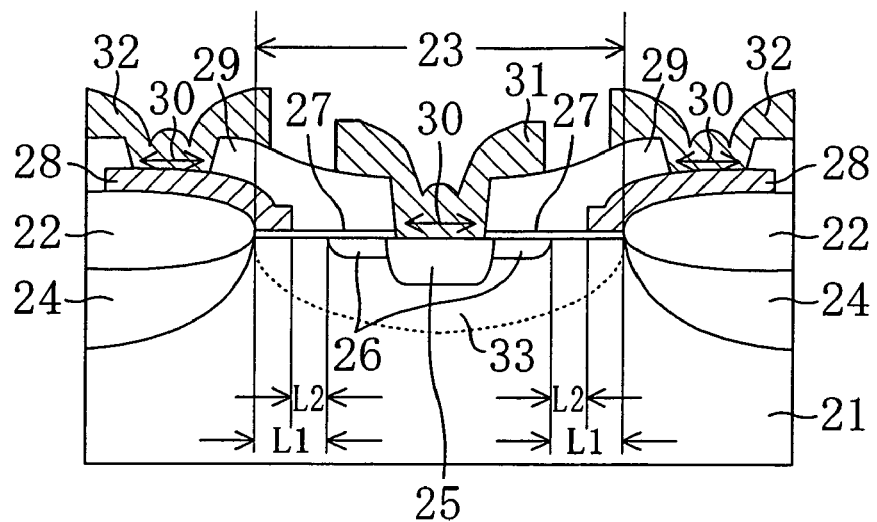
FIG. 1 is a sectional view schematically showing a semiconductor device according to a first embodiment of the present invention.
Figure 2:
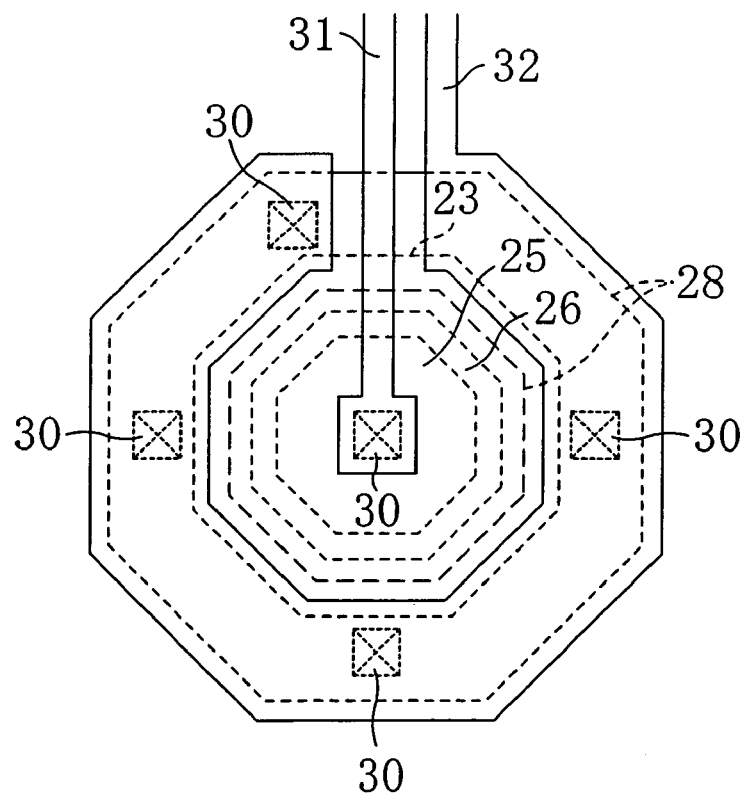
FIG. 2 is a plan view schematically showing the semiconductor device according to the first embodiment of the present invention.
Figure 5:
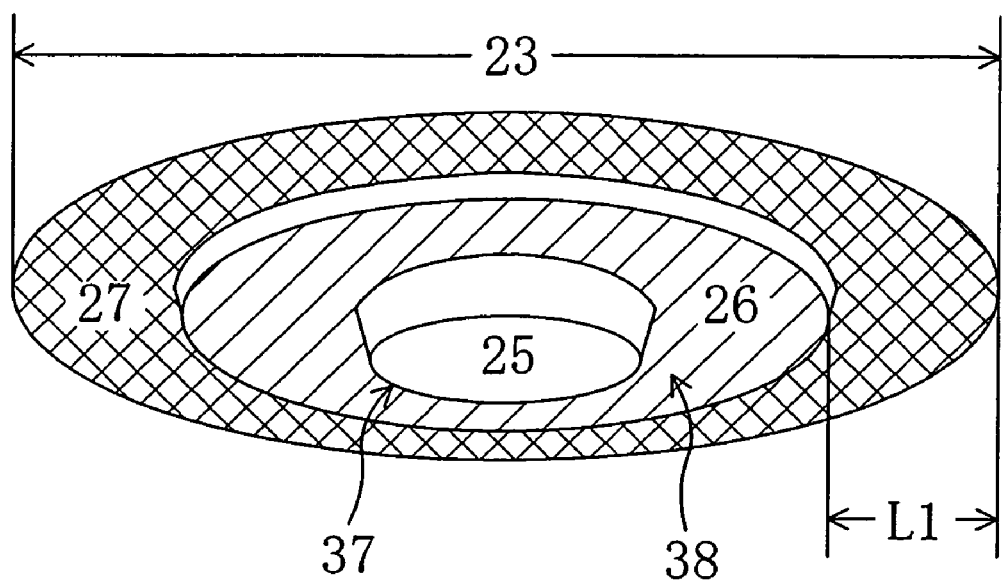
FIG. 5 is a virtual perspective view of a region surrounded with an isolation region of the semiconductor device according to the present invention, which is taken up from the inside of a well.

FIG. 1 is a sectional view schematically showing a semiconductor device according to a first embodiment of the present invention. FIG. 2 is a plan view schematically showing the device of FIG. 1 viewed from above.

The semiconductor device according to the first embodiment includes a semiconductor layer 21 of a first conductivity type, a heavily doped layer 25 of a second conductivity type formed in the semiconductor layer 21, and an intermediately doped layer 26 of the second conductivity type. The intermediately doped layer 26 is formed to adjoin and surround the heavily doped layer 25. The heavily doped layer 25 and the intermediately doped layer 26 are surrounded with an isolation region 22. A region surrounded with the isolation region 22 is referred hereinafter to as an active region 23. The semiconductor layer 21 of the first conductivity type corresponds to a well 21, which is formed in a semiconductor substrate (for example, a silicon substrate). Note that not the well but the semiconductor substrate may constitute the semiconductor layer 21 of the first conductivity type. Moreover, a semiconductor region contained in an SOI (Silicon on Insulator) substrate may constitute the semiconductor layer.

In the first embodiment, the well 21 of the first conductivity type is an n-type well and the heavily doped layer 25 of the second conductivity type is formed in a portion of the surface of the well 21. The heavily doped layer 25 of the second conductivity type and the intermediately doped layer 26 of the second conductivity type are a heavily p-doped layer 25 and an intermediately p-doped layer 26, respectively. The heavily p-doped layer 25 has a higher dopant concentration than the well 21. The intermediately p-doped layer 26 has a higher dopant concentration than the well 21 and a lower dopant concentration than the heavily p-doped layer 25. To be more specific, the dopant concentration of the heavily p-doped layer 25 is equal to or more than a hundred times that of the intermediately p-doped layer 26.

The intermediately p-doped layer 26 surrounds the heavily p-doped layer 25 in a substantially annular shape, or like a doughnut, and the heavily p-doped layer 25 protrudes from a portion corresponding to the doughnut hole toward a lower position, that is, inside the well 21. Accordingly, the heavily p-doped layer 25 is formed deeper than the intermediately p-doped layer 26 into the well 21, so that the junction depth of the heavily p-doped layer 25 is greater than that of the intermediately p-doped layer 26.

In the semiconductor device of the first embodiment, a breakdown phenomenon in the reverse direction arises in the pn junction between the well 21 and a region composed of the heavily p-doped layer 25 and the intermediately p-doped layer 26. The phenomenon-arising area functions as a clamp diode (a voltage regulator diode). Note that the voltage regulator element denotes an element in which an output voltage is kept constant regardless of variation in a load current.

Figure 10:
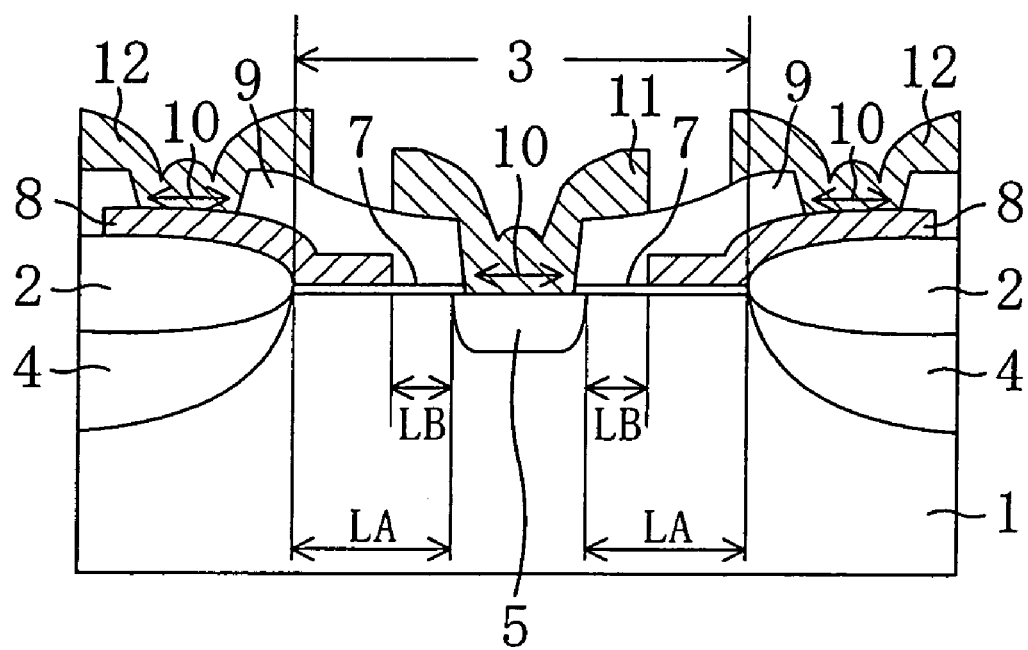
FIG. 10 is a sectional view schematically showing a conventional semiconductor device.

The inventors found that in a clamp diode portion of a conventional semiconductor device having no intermediately p-doped layer 26 (see FIG. 10), the breakdown phenomenon possibly arises not at the bottom of the heavily p-doped layer 5 but in the vicinity of the surface of the active region 3. If the breakdown phenomenon arises in the vicinity of the surface of the active region 3, breakdown value of the clamp voltage (breakdown voltage) fluctuates greatly, resulting in a lowered clamp breakdown voltage. On the other hand, in the semiconductor device of the first embodiment, the intermediately p-doped layer 26 is disposed to adjoin and surround the heavily p-doped layer 25, so that the occurrence of the breakdown phenomenon at the surface of the active region 23 can be prevented. This suppresses the breakdown voltage fluctuations to a small extent. In addition, the intermediately p-doped layer 26 can exert the effect in which as in the case of an LDD (lightly doped drain) in a transistor, the electric field created at the edge of the heavily p-doped layer 25 is released to improve the breakdown voltage.

Moreover, in the first embodiment, the effective dopant concentration of the intermediately p-doped layer 26 is set at $1 \times 10^{18}$ cm$^{-3}$ or lower. Herein, the effective dopant concentration of the intermediately p-doped layer 26 denotes a p-type dopant concentration obtained after n-type dopant contained in the intermediately p-doped layer 26 compensates for p-type dopant contained in the intermediately p-doped layer 26. To be more specific, the n-type dopant present in the smaller amount in the intermediately p-doped layer 26 compensates for part of the p-type dopant present in the larger amount therein. The concentration of the remaining p-type dopant available as a charge carrier is the effective dopant concentration. For ease in manufacturing this semiconductor device, the effective dopant concentration of the intermediately p-doped layer 26 is preferably from $1 \times 10^{15}$ cm$^{-3}$ to $1 \times 10^{18}$ cm$^{-3}$ inclusive.

To the voltage regulator element according to the first embodiment having the intermediately p-doped layer 26 with an effective dopant concentration of $1 \times 10^{18}$ cm$^{-3}$ or lower, a voltage in the reverse direction of the pn junction is applied in gradually increasing voltage from zero volts. Then, as shown in FIG. 3, no current flows until a predetermined voltage (10 V in this element) is applied thereto. When the applied voltage is beyond the predetermined voltage, a current begins to flow. From then on, the higher the applied voltage is, the greater the current value becomes. This is probably because the breakdown voltage of the element is constant and does not fluctuate, so that whether a current flows or not is strictly determined with the predetermined voltage (breakdown voltage) as a threshold. In the graph in FIG. 3, the voltage-current characteristic of the voltage regulator element according to the first embodiment is shown as follows. From 0 V to 10 V, the current value is kept 0 mA and a line is traced to extend along the voltage axis. Beyond 10 V, the current value increases in proportion to the voltage increase, and a line is traced to go up. At the point indicating 10 V (breakdown voltage) and 0 mA, the two lines are connected to each other and this point is the definite bending point of the voltage-current characteristic graph.

On the other hand, if the effective dopant concentration of the intermediately p-doped layer 26 is higher than $1 \times 10^{18}$ cm$^{-3}$, the voltage-current characteristic varies at the rising edge of the characteristic graph, as shown in FIG. 4. In other words, the graph shows a so-called wildly fluctuant condition. To be more specific, when the voltage placed on the voltage regulator element is gradually increased from 0 V, the voltage (breakdown voltage) at which a current begins to flow varies. Therefore, unlike the voltage-current characteristic of the first embodiment shown in FIG. 3, no current flows until the voltage is to some extent beyond a predetermined voltage (about 0.7 V at the maximum). Once a current flows, the voltage temporarily falls to the proximity of the predetermined voltage and then increases again. In the observation of the graph in accordance with this characteristic, no definite bending point appears at the predetermined voltage (10 V in this graph) and the trace thereof discontinuously changes from the line indicating that no current flows regardless of a voltage increase to the line indicating that a current increases according to a voltage increase.

Depending upon such a difference in the effective dopant concentration of the intermediately p-doped layer 26, the breakdown voltage variations differ in magnitude. The reason for this is considered as follows.

If the effective dopant concentration of the intermediately p-doped layer 26 is $1\times10^{18}$ cm$^{-3}$ or lower, the concentration gradient of the dopant reaches maximum at between the bottom and side surfaces of the heavily p-doped layer 25 and the well 21. Therefore, it is considerable that the breakdown phenomenon is initiated at a portion having a small radius of curvature, that is to say, in the vicinity of a border 37 between the side surface and the bottom surface (the under surface) of the heavily p-doped layer 25. This is because the electric field concentrates on the portion with a small radius of curvature. Since the vicinity of the border 37 is very narrow, the variation in the probability of occurrence of high energy electrons serving as a source of an avalanche phenomenon is small. Accordingly, the variation in the voltage causing the breakdown phenomenon corresponding to the variation in the probability of occurrence of high energy electrons is also suppressed to be small.

In contrast to this, if the effective dopant concentration of the intermediately p-doped layer 26 is more than $1\times10^{18}$ cm$^{-3}$, the concentration gradient of the dopant reaches maximum at a pn junction portion having a planer structure widespreadly expanding between the bottom surface 38 of the intermediately p-doped layer 26 and the well 21. Therefore, the breakdown phenomenon easily occurs starting from any one point of the bottom surface 38 of the intermediately p-doped layer 26. Since the bottom surface 38 has a wide area, the variation in the probability of occurrence of high energy electrons serving as a source of an avalanche phenomenon increases according to the area. Thus, in the case where the breakdown phenomenon arises at the bottom surface 38 of the intermediately p-doped layer 26, the breakdown voltage varies.

Consider the magnitude of variation in the above-described breakdown voltage from the viewpoint of the current-voltage characteristic. As shown in FIG. 6, in the voltage regulator element according to the first embodiment, the breakdown voltage in applying a low current is stable. On the other hand, if the effective dopant concentration of the intermediately p-doped layer 26 is more than $1\times10^{18}$ cm$^{-3}$, as shown in FIG. 7, the breakdown voltage in applying a low current fluctuates and becomes unstable. Since the voltage value of each plotted point in FIG. 7 is obtained by leveling the unstable voltage value relative to each current value within a certain measurement time, the actual variation in the breakdown voltage in the case of the low current is greater than the variation shown in FIG. 7.

Moreover, a comparison of FIG. 6 with FIG. 7 indicates that the lowest current value capable of causing the breakdown phenomenon shown in FIG. 6 is smaller than that shown in FIG. 7. Specifically, the voltage regulator element of the first embodiment can attain a desired constant voltage by applying a lower current than that applied to the voltage regulator element with the intermediately p-doped layer 26 of an effective dopant concentration more than $1\times10^{18}$ cm$^{-3}$. This lowers the set current of the load circuit in the semiconductor device, thereby enabling reduction of the power consumption of the device and stabilization of the operation of the load circuit.

Next description will be made of elements other than the heavily p-doped layer 25 and the intermediately p-doped layer 26 which constitute the semiconductor device according to the first embodiment.

The isolation region 22 of the semiconductor device according to the first embodiment is formed of an isolation insulating film, which is formed by LOCOS technique. Immediately below the isolation region 22, a channel stopper layer 24 is introduced in which n-type dopant diffuses at a higher dopant concentration than that of the well 21. The channel stopper layer 24 serves to prevent the occurrence of a conduction channel of a parasitic MOS structure.

The intermediately p-doped layer 26 is formed apart from the isolation region 22 by a distance L1. The reason for this separation is to suppress fluctuations in the breakdown voltage of the device with passage of time.

On the active region 23, an insulating layer 27 is formed which has a smaller thickness than the isolation region 22. The insulating layer 27 serves to electrically insulate an electrode 28 from the well 21. The electrode 28 is formed to extend on the insulating layer 27 and the isolation region 22.

Viewed from above the semiconductor device, as shown in FIG. 2, the electrode 28 annularly surrounds the active region 23. With the heavily p-doped layer 25 as center, the electrode 28 extends from the isolation region 22 and terminates at a position located above the outside of the intermediately p-doped layer 26 and apart from the outer edge of the intermediately p-doped layer 26 by a predetermined distance L2. In other words, with the heavily p-doped layer 25 as center, the electrode 28 terminates at the midway between the outer edge of the intermediately p-doped layer 26 and the edge of the isolation region 22 and apart outwardly from the edge of the intermediately p-doped layer 26 by the predetermined distance L2. The terminal of the electrode 28 is positioned on the insulating layer 27. Thus, the electrode 28 is spaced by the predetermined distance L2 from the intermediately p-doped layer 26, which makes it difficult to trap electrons and holes in the resulting space of the insulating layer 27. As a result, the breakdown voltage fluctuations of the device can be reduced.

The heavily p-doped layer 25 and the electrode 28 are connected to a first interconnect 31 for the the heavily p-doped layer and a second interconnect 32 for the electrode by way of contact holes 30, 30, . . . opened through an interlayer insulating film 29, respectively. Both the first interconnect 31 and the second interconnect 32 are made of aluminum.

In addition, a lightly doped layer 33 of n-type is provided in the active region 23. The dopant concentration of the lightly doped layer 33 is greater than that of the well 21 and smaller than that of the intermediately p-doped layer 26. In the active region 23, the lightly doped layer 33 covers the under surfaces of the heavily p-doped layer 25 and the intermediately p-doped layer 26. The lightly doped layer 33 serves as a region for regulating the magnitude of the breakdown voltage occurring between the well 21 and a region composed of the heavily p-doped layer 25 and the intermediately p-doped layer 26. The magnitude of the breakdown voltage is regulated by the type and the concentration of dopant contained in the lightly doped layer 33.

In the semiconductor device according to the first embodiment, a desired constant voltage is provided by applying, with the electrode 28 of a single-layered structure made of polycrystalline silicon made floating, a negative voltage to the heavily p-doped layer 25 through the first interconnect 31 until the applied voltage reaches the breakdown voltage in the reverse direction of the pn junction between the well 21 and the region composed of the heavily p-doped layer 25 and the intermediately p-doped layer 26. As another technique, the desired constant voltage is also obtained by applying, with the electrode 28 of a single-layered structure made of polycrystalline silicon made floating, a positive voltage to the well 21 until the applied voltage reaches the breakdown voltage in the reverse direction of the pn junction between the well 21 and the region composed of the heavily p-doped layer 25 and the intermediately p-doped layer 26. A stable occurrence of the desired constant voltage is very important in order for the load circuit in the semiconductor device to operate stably. Note that in the first embodiment the desired constant voltage is set at a value ranging from 9.5 to 10.5 V by the absolute value.

In the semiconductor device according to the first embodiment, the intermediately p-doped layer 26 exists which is formed to adjoin and surround the heavily p-doped layer 25, so that the fluctuations in the breakdown voltage decrease and in addition the breakdown voltage itself increases. Furthermore, the effective dopant concentration of the intermediately p-doped layer 26 is $1 \times 10^{18}$ cm$^{-3}$ or lower, so that the breakdown voltage fluctuations can be suppressed to a smaller extent and the power consumption can be reduced. Therefore, the operation of the semiconductor device can be stabilized. Moreover, the dopant concentration of the heavily p-doped layer 25 is equal to or more than a hundred times that of the intermediately p-doped layer 26, so that the breakdown voltage fluctuations are further suppressed.

Next, process steps of a fabrication method of a semiconductor device according to the first embodiment will be described with reference to FIGS. 8A to 8C and FIGS. 9A to 9C.

Figure 8A:
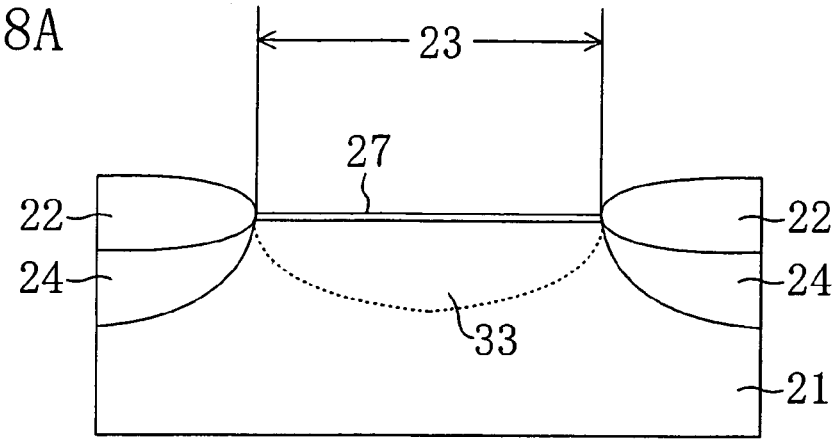
FIGS. 8A to 8C are sectional views schematically showing the first half of a fabrication flow of the semiconductor device according to the first embodiment of the present invention.

First, a semiconductor substrate is prepared in which the well 21 has been formed. As shown in FIG. 8A, the well 21 is formed with the isolation region 22. These actions correspond to the step of forming the isolation region 22. The isolation region 22 is formed by the LOCOS technique or the like. The isolation region 22 can be shaped, for example, in a regular octagon as shown in FIG. 2. Note that the well 21 has an n-type dopant concentration of the order of $10^{16}$ cm$^{-3}$ and a predetermined region surrounded with the isolation region 22 corresponds to the active region 23.

In the formation step of the isolation region 22, with an opening formed in a mask of a nitride film for a LOCOS film formation, a portion of the well 21 located under the isolation region 22 is formed in advance with the channel stopper layer 24. The channel stopper layer 24 is formed, for example, by implanting n-type dopant ions into the well 21 at a dose of the order of $10^{13}$ cm$^{-2}$. As a result of this implantation, the channel stopper layer 24 is formed which has a dopant concentration of the order of $10^{18}$ cm$^{-3}$.

Thereafter, in the step of forming the insulating layer 27, the insulating layer 27 of an oxide film is formed on the active region 23 surrounded with the isolation region 22. The lightly doped layer 33 is then formed in the active region 23. The lightly doped layer 33 is formed, for example, in such a manner that using the isolation region 22 as a mask, n-type dopant ions are implanted into the active region 23 at a dose of the order of $10^{12}$ cm$^{-2}$. As a result of this implantation, the lightly doped layer 33 of n-type having a dopant concentration of the order of $10^{17}$ cm$^{-3}$ is formed across almost the whole area of the active region 23.

Figure 8B:
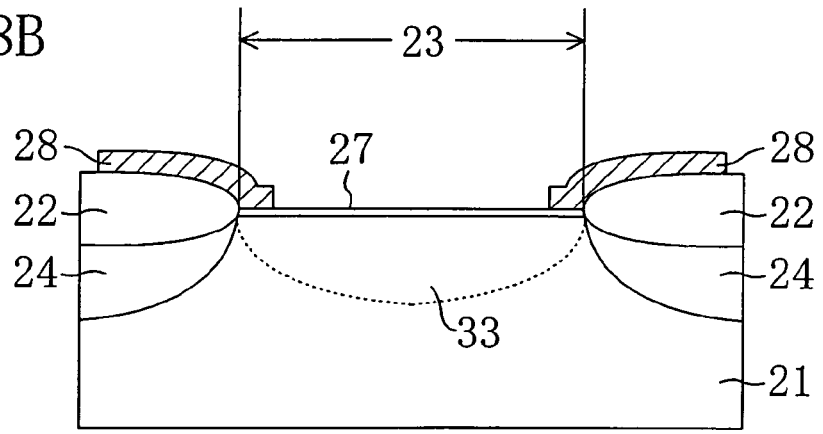

As shown in FIG. 8B, the electrode 28 is formed on the insulating layer 27. The electrode 28 is formed in such a manner that after the deposition of a polysilicon film on the substrate, the deposited film is patterned. The electrode 28 can be shaped, for example, in a regular octagonal ring. The obtained electrode 28 is placed to extend on the isolation region 22 and the insulating layer 27. An end of the electrode 28 placed on the insulating layer 27 is preferably positioned inwardly apart from the opening end of the isolation region 22 by a predetermined distance. The predetermined distance is preferably about 1.5 µm. Note that the opening end of the isolation region 22 is the border between the isolation region 22 and the active region 23.

Figure 8C:
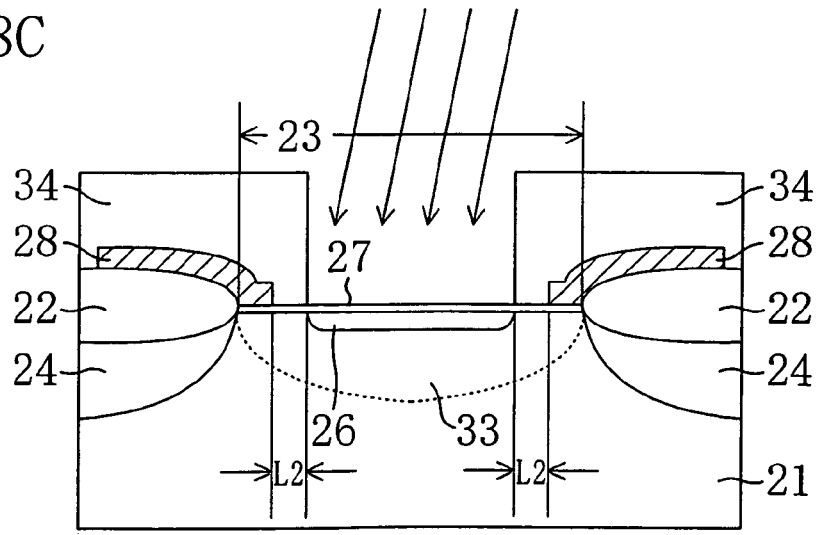

Next, as shown in FIG. 8C, a portion of the well 21 is formed with the intermediately p-doped layer 26 expanding inwardly from the surface of the well 21. The intermediately p-doped layer 26 is formed by implanting p-type dopant ions into the well 21. Hereinafter, a series of actions in the formation step of the intermediately p-doped layer 26 will be described.

First, the substrate is coated with a photo resist, after which the resist is patterned to form a first resist film 34 with an opening. The opening is preferably shaped, for example, in a regular octagon. In this formation, it is preferable that the first resist film 34 is placed on the isolation region 22, the electrode 28 and the insulating layer 27 and that the opening end of the film is located inwardly apart from the end of the electrode 28 present on the insulating layer 27 by a predetermined distance. The predetermined distance is preferably about 0.8 µm. Thereafter, using the first resist film 34 as a mask, p-type dopant ions are implanted into the well 21 at a dose of the order of $10^{13}$ cm$^{-2}$ to form the intermediately p-doped layer 26 with a p-type dopant concentration of the order of $10^{18}$ cm$^{-3}$. N-type and p-type dopants doped for various purposes, mainly n-type dopant for forming the lightly doped layer 33, compensate for the p-type dopant implanted in this step, so that the dopant concentration of the intermediately p-doped layer 26 is eventually p-type, and an effective dopant concentration of the order of $10^{17}$ cm$^{-3}$. After the implantation, the first resist film 34 is removed. As a result of this step, the intermediately p-doped layer 26 spaced apart from the electrode 28 by the predetermined distance L2 is formed in the upper portion of the lightly doped layer 33. The predetermined distance L2 is preferably 0.4 µm or greater, more preferably about 0.8 µm.

Figure 9A:
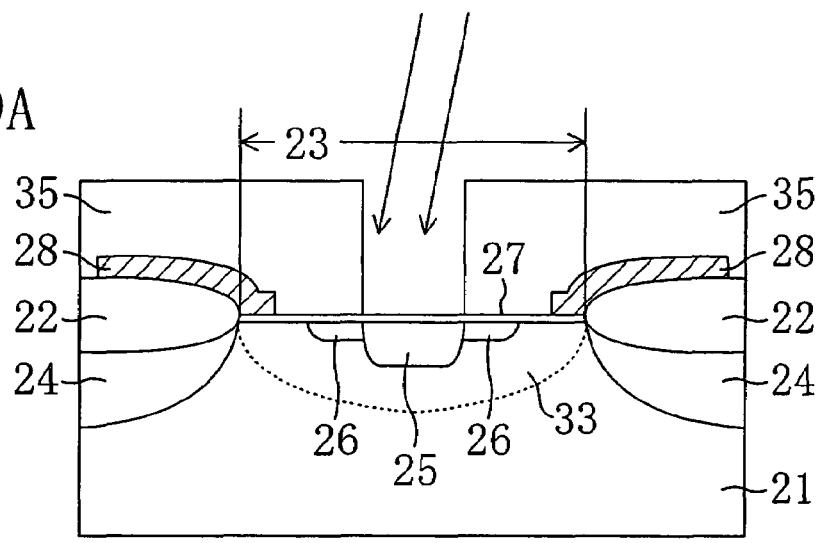
FIGS. 9A to 9C are sectional views schematically showing the second half of the fabrication flow of the semiconductor device according to the first embodiment of the present invention.

As shown in FIG. 9A, a portion of the well 21 is formed with the heavily p-doped layer 25 expanding inwardly from the surface of the well 21. The heavily p-doped layer 25 is formed by further implanting p-type dopant ions into the well 21. Hereinafter, a series of actions in the formation step of the heavily p-doped layer 25 will be described.

First, the substrate is coated with a photo resist, after which the resist is patterned to form a second resist film 35 with an opening. The opening is preferably shaped, for example, in a regular octagon. In this formation, it is preferable that the second resist film 35 is placed on the isolation region 22, the electrode 28 and the insulating layer 27 and that the opening end of the film is located inwardly apart from the outer end of the intermediately p-doped layer 26 by a predetermined distance. The predetermined distance is preferably about 0.8 µm. Thereafter, using the second resist film 35 as a mask, p-type dopant ions are implanted into the well 21 at a dose of the order of $10^{15}$ cm$^{-2}$ to form the heavily p-doped layer 25 with a p-type dopant concentration of the order of $10^{20}$ cm$^{-3}$. The heavily p-doped layer 25 is formed so that it is located in the center portion of the intermediately p-doped layer 26 expanding in an octagonal shape and has a greater junction depth than the intermediately p-doped layer 26. The heavily p-doped layer 25 formed in such a junction depth desirably ensures the initiation of the voltage breakdown at the vicinity of the border 37 between the bottom and side surfaces of the heavily p-doped layer 25. After the implantation, the second resist film 35 is removed. As a result of this step, the heavily p-doped layer 25 is formed in contact with the intermediately p-doped layer 26. In the semiconductor device according to the first embodiment, the dopant concentration of heavily p-doped layer 25 is equal to or more than a hundred times that of the intermediately p-doped layer 26. In terms of the fabrication process thereof, the upper limit of the dopant concentration of heavily p-doped layer 25 is about ten thousands times that of the intermediately p-doped layer 26.

Figure 9B:
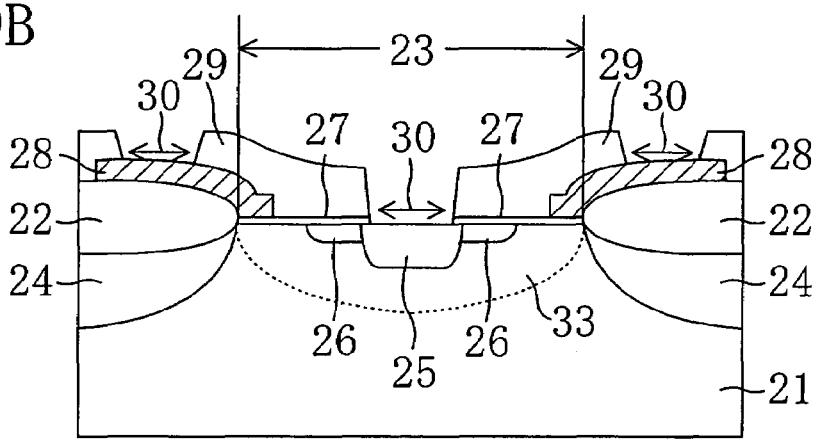

Next, as shown in FIG. 9B, the interlayer insulating film 29 is deposited above the entire surface of the substrate, and then the contact holes 30, 30, . . . reaching the heavily p-doped layer 25 and the electrode 28, respectively, are formed through the interlayer insulating film 29.

Figure 9C:
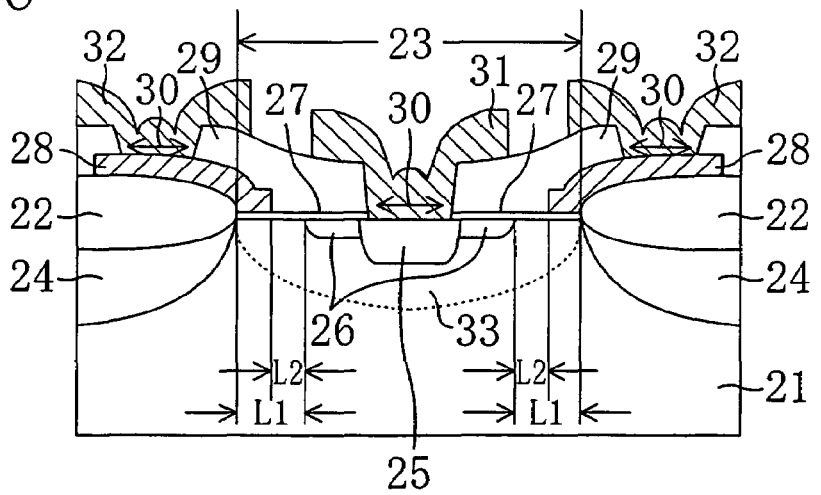

As shown in FIG. 9C, an aluminum alloy film is deposited on the surfaces of the contact holes 30, 30, . . . and the interlayer insulating film 29, after which the film is patterned to form the first interconnect 31 connected to the heavily p-doped layer 25 and the second interconnect 32 connected to the electrode 28.

Note that the dopant concentration and the effective dopant concentration noted above are estimated by process simulation. Even if these concentrations are not estimated by process simulation but actually measured by SIMS or the like, the intermediately p-doped layer 26 with the effective dopant concentration set at $1 \times 10^{18}$ cm$^{-3}$ or lower stabilizes the breakdown voltage in applying a low current and decreases the lowest value of the current capable of causing the breakdown phenomenon. Preferably, the actually measured effective dopant concentration of the intermediately p-doped layer 26 is also from $1 \times 10^{15}$ cm$^{-3}$ to $1 \times 10^{18}$ cm$^{-3}$ inclusive.

With the fabrication steps described above, the structure of the semiconductor device shown in FIGS. 1 and 2 can easily be fabricated. In order to add no further formation step to the process flow of the device, the intermediately p-doped layer 26 is preferably formed by the common formation step with an LDD diffusion layer of a transistor, which will be formed in another region of the semiconductor substrate.

(Second Embodiment)

A second embodiment differs from the first embodiment in that the type of dopant diffusing in the lightly doped layer 33 is p-type and that the intermediately p-doped layer 26 has a dopant concentration different from that in the first embodiment. The other composition is identical to that of the first embodiment. Only the different points of the second embodiment from the first embodiment will be described below.

In the second embodiment, the lightly doped layer 33 of p-type is formed in the active region 23 in the formation step of the lightly doped layer 33. Specifically, using the isolation region 22 as a mask, p-type dopant ions are implanted into the active region 23 at a dose of the order of $10^{11}$ cm$^{-2}$ to form the lightly doped layer 33 of p-type having a dopant concentration of the order of $10^{16}$ cm$^{-3}$ across almost the whole area of the active region 23.

In a later step of forming the intermediately p-doped layer 26, using the first resist film 34 as a mask, p-type dopant ions are implanted into the well 21 at a dose of the order of $10^{13}$ cm$^{-2}$ to form the intermediately p-doped layer 26 with a p-type dopant concentration of the order of $10^{17}$ cm$^{-3}$. The heavily p-doped layer 25 has a dopant concentration of the order of $10^{20}$ cm$^{-3}$, which is equal to or more than a hundred times that of the intermediately p-doped layer 26. N-type and p-type dopants doped for various purposes compensate for the p-type dopant contained in the intermediately p-doped layer 26, so that the effective dopant concentration of the intermediately p-doped layer 26 is eventually in the order of $10^{17}$ cm$^{-3}$.

Since the semiconductor device according to the second embodiment has the intermediately p-doped layer 26 with a dopant concentration of $1 \times 10^{18}$ cm$^{-3}$ or lower, an avalanche phenomenon can be induced stably and more surely than the first embodiment at the pn junction portion between the vicinity of the border 37 between the side and under surfaces of the heavily p-doped layer 25 and the well 21. Therefore, in the voltage regulator element of the semiconductor device, the breakdown voltage in applying a low current is stabilized and the lowest value of the current capable of causing the breakdown phenomenon decreases. This reduces power consumption and stabilizes the operation of the load circuit in the device as well. In addition, since the dopant concentration of the heavily p-doped layer 25 is equal to or more than a hundred times that of the intermediately p-doped layer 26, the breakdown voltage fluctuations are further suppressed. Moreover, since the lightly doped layer 33 is p-type, the breakdown voltage can be set at a higher voltage than that of the first embodiment.

The embodiments described above are just preferred examples of the present invention, and the present invention is not limited to these embodiments. For example, it is possible for even the semiconductor device with no lightly doped layer 33 to suppress the breakdown voltage variation.

Only if the intermediately p-doped layer 26 is formed to adjoin and surround the heavily p-doped layer 25 and the dopant concentrations decrease in the order of the heavily p-doped layer 25, the intermediately p-doped layer 26 and the well 21, the effect of the present invention can be exerted in which the breakdown voltage fluctuations are suppressed and the breakdown voltage itself increases.

In the embodiments described above, the intermediately p-doped layer 26 is formed apart from the isolation region 22 by the distance L1. Alternatively, even if it adjoins the isolation region 22, the breakdown voltage variation is suppressed as well and the breakdown voltage in applying a low current in the case of operating as the voltage regulator element is stabilized. However, variation in the breakdown voltage with passage of time is slightly increased.

In the embodiments described above, the electrode 28 terminates at the midway between the edge of the intermediately p-doped layer 26 and the edge of the isolation region 22 and apart from the edge of the intermediately p-doped layer 26 by the distance L2. Even if the electrode 28 terminates at the proximity of the edge of the intermediately p-doped layer 26, or even if the electrode 28 is absent, the breakdown voltage variation is suppressed as well and the breakdown voltage in applying a low current in the case of operating as the voltage regulator element is stabilized. However, variation in the breakdown voltage with passage of time is slightly increased.

In the embodiments described above, the isolation region 22 is formed by LOCOS technique. If it is formed by STI (Shallow Trench Isolation) technique, no channel stopper layer 24 is provided in the device. Therefore, the phenomenon does not occur in which electrons or holes are trapped at the interface between the isolation region 22 and the channel stopper layer 24. If this phenomenon occurs, the electric field in the pn junction plane directed from the well 21 toward the heavily p-doped layer 25 is weakened and varies according to the amount of the trapped electrons or holes. Use of the STI technique avoids this variation in the electric filed, so that variation in the breakdown voltage with passage of time desirably decreases.

The electrode 28 may be made basically of any conductive material such as polycrystalline silicon, a stacked structure of polycrystalline silicon and silicide, or aluminum. In addition, as shown in FIGS. 1 and 2, one contact hole 30 is formed on the heavily p-doped layer 25 and one contact hole 30 is formed on each side, that is, on each of the top, bottom, left, and right sides of the electrode 28. Alternatively, the contact hole 30 formed on each position may be formed in plurality.

In the embodiments described above, each conductivity type may be reversed. In addition, another element structure may be provided.

What is claimed is:

1. A semiconductor device comprising a voltage regulator element,
   wherein the voltage regulator element includes:
   a heavily doped layer of a second conductivity type which is formed in a semiconductor layer of a first conductivity type;
   an intermediately doped layer of the second conductivity type which is formed to adjoin and surround the heavily doped layer; and
   an isolation region which is formed to surround a region containing the heavily doped layer and the intermediately doped layer,
   the heavily doped layer of the second conductivity type has a higher dopant concentration than the semiconductor layer of the first conductivity type,
   the intermediately doped layer of the second conductivity type has a dopant concentration higher than the semiconductor layer of the first conductivity type and lower than the heavily doped layer of the second conductivity type,
   a region of the semiconductor layer surrounded with the isolation region, except under the isolation region, is formed with a lightly doped layer which covers the under surfaces of the heavily doped layer and the intermediately doped layer, and
   the lightly doped layer has a dopant concentration higher than the semiconductor layer of the first conductivity type and lower than the intermediately doped layer of the second conductivity type.

2. The device of claim 1, wherein the concentration of the second conductivity type dopant contained in the intermediately doped layer is $1 \times 10^{18}$ cm$^{-3}$ or lower.

3. The device of claim 1, wherein the dopant concentration of the heavily doped layer is equal to or more than a hundred times that of the intermediately doped layer.

4. A semiconductor device comprising a voltage regulator element,
   wherein the voltage regulator element includes:
   a heavily doped layer of a second conductivity type which is formed in a semiconductor layer of a first conductivity type;
   an intermediately doped layer of the second conductivity type which is formed to adjoin and surround the heavily doped layer; and
   an isolation region which is formed to surround a region containing the heavily doped layer and the intermediately doped layer,
   the heavily doped layer of the second conductivity type has a higher dopant concentration than the semiconductor layer of the first conductivity type,
   the intermediately doped layer of the second conductivity type has a higher dopant concentration than the semiconductor layer of the first conductivity type,
   the dopant concentration of the heavily doped layer is equal to or more than a hundred times that of the intermediately doped layer,
   a region of the semiconductor layer surrounded with the isolation region, except under the isolation region, is formed with a lightly doped layer which covers the under surfaces of the heavily doped layer and the intermediately doped layer, and
   the lightly doped layer has a dopant concentration higher than the semiconductor layer of the first conductivity type and lower than the intermediately doped layer of the second conductivity type.

5. The device of claim 4, wherein an effective dopant concentration of the intermediately doped layer is $1 \times 10^{18}$ cm$^{-3}$ or lower.

6. The device of claim 1, wherein the junction depth of the heavily doped layer is greater than that of the intermediately doped layer.

7. The device of claim 4, wherein the junction depth of the heavily doped layer is greater than that of the intermediately doped layer.

8. The device of claim 1,
   wherein the lightly doped layer has the first conductivity type.

9. The device of claim 4,
   wherein the lightly doped layer has the first conductivity type.

10. The device of claim 1, wherein the intermediately doped layer is formed apart from the isolation region.

11. The device of claim 4, wherein the intermediately doped layer is formed apart from the isolation region.

12. The device of claim 1,
    wherein an insulating layer is formed on the region of the semiconductor layer surrounded with the isolation region,
    the insulating layer includes an opening which exposes at least part of the heavily doped layer,
    an electrode is formed on the insulating layer and the isolation region, and
    with the heavily doped layer as center, the electrode extends from the isolation region and terminates at a position located above the outside of the intermediately doped layer.

13. The device of claim 4,
    wherein an insulating layer is formed on the region of the semiconductor layer surrounded with the isolation region,
    the insulating layer includes an opening which exposes at least part of the heavily doped layer,
    an electrode is formed on the insulating layer and the isolation region, and
    with the heavily doped layer as center, the electrode extends from the isolation region and terminates at a position located above the outside of the intermediately doped layer.

14. A semiconductor device comprising a voltage regulator element,
    wherein the voltage regulator element includes:
    a heavily doped layer of a second conductivity type which is formed in a semiconductor layer of a first conductivity type;
    an intermediately doped layer of the second conductivity type which is formed to adjoin and surround the heavily doped layer; and an isolation region which is formed to surround a region containing the heavily doped layer and the intermediately doped layer, the heavily doped layer of the second conductivity type has a higher dopant concentration than the semiconductor layer of the first conductivity type, the intermediately doped layer of the second conductivity type has a dopant concentration higher than the semiconductor layer of the first conductivity type and lower than the heavily doped layer of the second conductivity type, the semiconductor layer of the first conductivity type and the heavily doped layer collaboratively function as a voltage regulator diode, the junction depth of the heavily doped layer is greater than that of the intermediately doped layer, the dopant concentration of the intermediately doped layer is made lower than that of the heavily doped layer so that the voltage-breakdown initiation region is present in the border between the semiconductor layer of the first conductivity type and the heavily doped layer, a region of the semiconductor layer surrounded with the isolation region, except under the isolation region, is formed with a lightly doped layer which covers the under surfaces of the heavily doped layer and the intermediately doped layer, and the lightly doped layer has a dopant concentration higher than the semiconductor layer of the first conductivity type and lower than the intermediately doped layer of the second conductivity type.

15. The device of claim 14, wherein the voltage-breakdown initiation region is present in the vicinity of the border between the bottom and side surfaces of the heavily doped layer, and the heavily doped layer and the intermediately doped layer differ in the dopant concentration by a hundred times or more.

16. The device of claim 1, wherein the semiconductor layer of the first conductivity type is a semiconductor substrate of the first conductivity type or a well of the first conductivity type.

17. The device of claim 4, wherein the semiconductor layer of the first conductivity type is a semiconductor substrate of the first conductivity type or a well of the first conductivity type.

18. The device of claim 14, wherein the semiconductor layer of the first conductivity type is a semiconductor substrate of the first conductivity type or a well of the first conductivity type.

19. The device of claim 14, wherein the lightly doped layer has the first conductivity type.

20. The device of claim 14, wherein the semiconductor layer of the first conductivity type, the heavily doped layer and the intermediately doped layer collaboratively function as a voltage regulator diode.

* * * * *